United States Patent
Jung et al.

(10) Patent No.: US 10,770,148 B2
(45) Date of Patent: Sep. 8, 2020

(54) NONVOLATILE MEMORY DEVICE AND OPERATING METHOD OF THE SAME

(71) Applicant: SAMSUNG ELECTRONICS CO., LTD., Suwon-si, Gyeonggi-do (KR)

(72) Inventors: Won-Taeck Jung, Hwaseong-Si (KR); So-Yeong Gwak, Incheon (KR); Sang-Wan Nam, Hwaseong-Si (KR)

(73) Assignee: Samsung Electronics Co., Ltd., Suwon-si, Gyeonggi-do (KR)

( * ) Notice: Subject to any disclaimer, the term of this patent is extended or adjusted under 35 U.S.C. 154(b) by 67 days.

(21) Appl. No.: 15/959,323

(22) Filed: Apr. 23, 2018

(65) Prior Publication Data

US 2019/0088341 A1 Mar. 21, 2019

(30) Foreign Application Priority Data

Sep. 20, 2017 (KR) .......................... 10-2017-0121315

(51) Int. Cl.
*G11C 16/26* (2006.01)
*G11C 16/10* (2006.01)
*G11C 16/34* (2006.01)
*G11C 16/04* (2006.01)
*G11C 16/24* (2006.01)

(52) U.S. Cl.
CPC .............. *G11C 16/26* (2013.01); *G11C 16/10* (2013.01); *G11C 16/34* (2013.01); *G11C 16/3459* (2013.01); *G11C 16/0483* (2013.01); *G11C 16/24* (2013.01)

(58) Field of Classification Search
CPC ....... G11C 16/26; G11C 16/34; G11C 16/3459
USPC ..................................................... 365/185.21
See application file for complete search history.

(56) References Cited

U.S. PATENT DOCUMENTS

| | | | |
|---|---|---|---|
| 7,518,923 B2 | 4/2009 | Mokhlesi | |
| 7,733,699 B2* | 6/2010 | Roohparvar | G11C 16/0483 365/185.17 |
| 7,894,269 B2* | 2/2011 | Li | G11C 8/10 365/185.09 |
| 8,254,181 B2 | 8/2012 | Hwang et al. | |
| 8,654,590 B2* | 2/2014 | Aritome | G11C 11/5628 365/185.02 |
| 8,837,223 B2 | 9/2014 | Sakamoto et al. | |
| 2017/0076802 A1* | 3/2017 | Mokhlesi | G11C 16/3459 |

FOREIGN PATENT DOCUMENTS

JP 2009272016 A 11/2009
JP 2010027165 A 2/2010

* cited by examiner

*Primary Examiner* — Anthan Tran
(74) *Attorney, Agent, or Firm* — Volentine, Whitt & Francos, PLLC

(57) ABSTRACT

An operation method of a nonvolatile memory device includes applying a program voltage to a selected word line and programming a selected memory cell connected to the selected word line; reading an adjacent memory cell connected to an adjacent word line of the selected word line; and verifying the selected memory cell by adjusting charge sharing between the selected memory cell and a sensing node, which is connected to the selected memory cell through a bit line.

20 Claims, 16 Drawing Sheets

NONVOLATILE MEMORY DEVICE AND OPERATING METHOD OF THE SAME

CROSS-REFERENCE TO RELATED APPLICATION

This application claims the benefit of Korean Patent Application No. 10-2017-0121315, filed on Sep. 20, 2017, in the Korean Intellectual Property Office, the disclosure of which is incorporated herein in its entirety by reference.

BACKGROUND

The disclosure relates to a memory device, and more particularly, to a nonvolatile memory device performing adaptive verifying operations.

A semiconductor memory device is a memory device implemented by using semiconductors such as silicon (Si), germanium (Ge), gallium arsenide (GaAs), indium phosphide (InP), and so on. Semiconductor memory devices may be sorted into volatile memory devices and nonvolatile memory devices.

A nonvolatile memory device is a memory device in which stored data is not erased when the memory device is out of power supply. Nonvolatile memory devices include ROM, PROM, EPROM, EEPROM, a flash memory device, PRAM, MRAM, RRAM, FRAM, and the like. Flash memory devices may be sorted into a NOR type and a NAND type.

SUMMARY

The disclosure provides a nonvolatile memory device and operation methods thereof to improve retention quality by adaptively performing verifying operations.

According to an aspect of the disclosure, there is provided an operation method of a nonvolatile memory device. The method includes applying a programming voltage to a selected word line and programming a selected memory cell that is connected to the selected word line, reading an adjacent memory cell that is connected to an adjacent word line of the selected word line, and verifying the selected memory cell by adjusting charge sharing between the selected memory cell and a sensing node, which is connected to the selected memory cell through a bit line.

According to another aspect of the disclosure, there is provided an operation method of a nonvolatile memory device. The method includes applying a programming voltage to a selected word line and programming a selected memory cell that is connected to the selected word line, reading an adjacent memory cell that is connected to an adjacent word line directly above or directly under the selected word line by using a first reference voltage, and verifying the selected memory cell by changing a sensing time based on a result of reading the adjacent memory cell. The sensing time is a time that a bit line sensing signal is applied to control charge sharing of a sensing node.

According to another aspect of the disclosure, there is provided a nonvolatile memory device. The nonvolatile memory device includes a memory cell array and a control logic. The memory cell array includes a plurality of memory cells connected to a plurality of bit lines. The control logic performs verification on a selected memory cell by reading an adjacent word line of a selected word line addressing the selected memory cell and adjusting charge sharing between the selected memory cell and a sensing node, which is connected to the selected memory cell through a bit line.

According to another aspect of the disclosure, there is provided a method executed by a nonvolatile memory device. The method includes: (1) programming a selected memory cell addressed by a selected word line, (2) reading an adjacent memory cell addressed by an adjacent word line, which is adjacent to the selected word line, to determine a program state of the adjacent memory cell, (3) determining, based upon the program state, whether to apply a first verification operation or a second verification operation, which differs from the first verification operation, as a selected verification operation, and (4) applying the selected verification operation to the selected memory cell for determining whether the selected memory cell is programmed to a predetermined program state.

BRIEF DESCRIPTION OF THE DRAWINGS

Embodiments of the disclosure will be more clearly understood from the following detailed description taken in conjunction with the accompanying drawings in which.

DETAILED DESCRIPTION OF THE EMBODIMENTS

Figure 1:
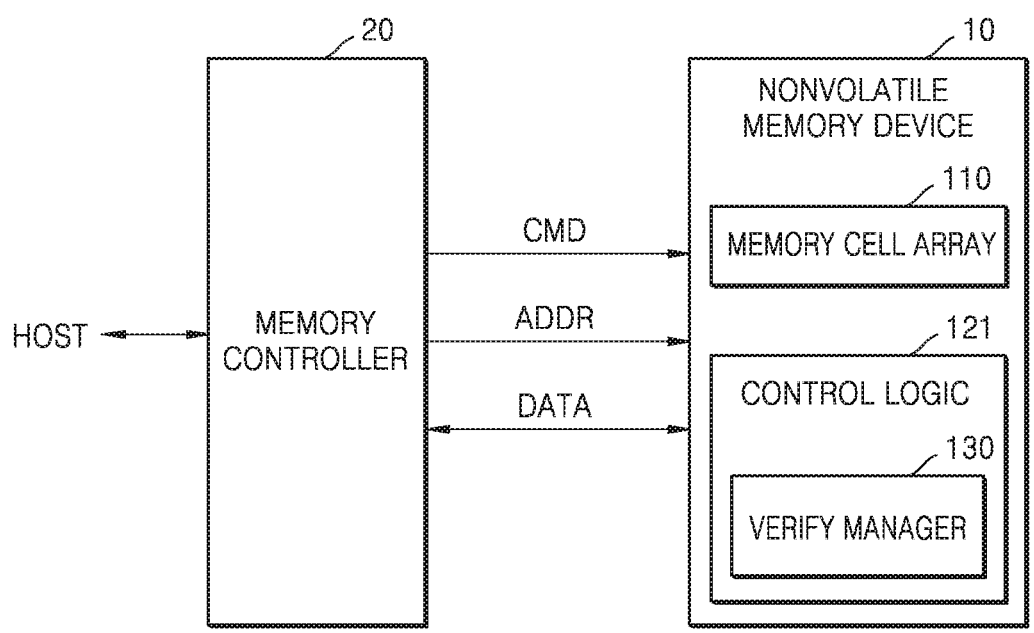
FIG. 1 is a block diagram illustrating a nonvolatile memory system according to an embodiment of the disclosure.

FIG. 1 is a block diagram illustrating a nonvolatile memory system according to an embodiment of the disclosure.

With reference to FIG. 1, a nonvolatile memory system 1 may be provided as one of computing systems such as a workstation, a netbook, a personal digital assistant (PDA), a portable computer, a web tablet, a wireless phone, a mobile phone, a smart phone, an e-book, a portable multimedia player (PMP), a portable game player, a navigator, a black box, a digital camera, a digital multimedia broadcasting (DMB) player, a digital audio recorder, a digital audio player, a digital picture player, a digital video recorder, a digital video player.

The nonvolatile memory system 1 may include a memory controller 20 and a nonvolatile memory device 10. In an embodiment, each of a host (HOST), the memory controller 20, and the nonvolatile memory device 10 may be provided as a chip, a package, a module, or the like. Also, the memory controller 20 and the nonvolatile memory device 10 may be provided in a mounted manner by using package on package (POP), ball grid arrays (BGAs), chip scale packages (CSPs), plastic leaded chip carrier (PLCC), plastic dual in-line package (PDIP), die in waffle pack, die in wafer form, chip on board (COB), ceramic dual in-line package (CERDIP), plastic metric quad flat pack (MQFP), thin quad flat pack (TQFP), small outline (SOIC), shrink small outline package (SSOP), thin small outline (TSOP), thin quad flatpack (TQFP), system in package (SIP), multi-chip package (MCP), wafer-level fabricated package (WFP), and wafer-level processed stack package (WSP).

The memory controller 20 may control the nonvolatile memory device 10 in response to a program request or a read request received from the host, HOST. For example, the memory controller 20 may transfer a program command CMD and an address ADDR to the nonvolatile memory device 10 in response to the program request received from the host, HOST. The address ADDR transferred from the memory controller 20 to the nonvolatile memory device 10 may be a physical address of the nonvolatile memory device 10. The memory controller 20 may exchange data, DATA, with the nonvolatile memory device 10.

The nonvolatile memory device 10 may perform operations such as programming, reading, and erasing in response to signals received from the memory controller 20. When the nonvolatile memory 10 performs programming on memory cells, a program voltage and a verifying voltage may be provided to each of the word lines WL according to an incremental step pulse programming (ISPP) method. In a programming operation using the ISPP method, a program pulse and verification pulses may be applied in one same program loop. Memory cells selected from a plurality of program loops may be programmed to be in a target state. Hereinafter, a programming operation may indicate that the nonvolatile memory device 10 applies a program voltage to a memory cell selected from a program loop, and a verifying operation may indicate that the nonvolatile memory device 10 applies a verifying voltage to a memory cell selected from a program loop. Also, "a programming operation on a word line" or "a reading operation on a word line" may indicate "a programming operation on a memory cell connected to a word line" or "a reading operation on a memory cell connected to a word line."

The nonvolatile memory device 10 may include a memory cell array 110 and a control logic 120, and the control logic 120 may include a verify manager 121. The memory cell array 110 may include a plurality of memory cells. The plurality of memory cells, for example, may be flash memory cells. Hereinafter, embodiments will be described taking a case in which the plurality of memory cells are NAND flash memory cells as an example. However, the present disclosure is not limited thereto, and in other embodiments, the plurality of memory cells may be resistive cells such as resistive RAM (RRAM), phase change RAM (PRAM), or magnetic RAM (MRAM).

The memory cell array 110 may be a three-dimension (3D) memory cell array. In the 3D memory cell array, memory cell arrays, each including an active region arranged on a silicon substrate and a circuit formed on or in the substrate as a circuit regarding operations on the memory cells, are formed in a monolithic manner on at least one physical level. The term "monolithic" indicates that each of layers included in the array is stacked directly on each of lower level layers. The 3D memory cell array includes NAND strings arranged in a vertical direction so that at least one memory cell may be arranged above another memory cell. The at least one memory may include charge trapping layers. However, the embodiment is not limited thereto, and in other embodiments, the memory cell array may be a two-dimension (2D) cell array.

As detailed descriptions about appropriate configurations of a 3D memory cell array including a plurality of levels and word lines and/or bit lines shared between levels, U.S. Pat. Nos. 7,679,133, 8,553,466, 8,654,587, 8,599,235, and U.S. Published patent application No. 2011/0233648 are incorporated herein by reference. Also, U.S. Published patent application No. 2014-0334232 and U.S. Pat. No. 8,488,381 are incorporated herein by reference.

In the embodiment, each of the memory cells included in the memory cell array 110 may be a multi-level cell (MLC) storing data of more than 2 bits. For example, the memory cells may be MLCs each storing 2-bit data. In another embodiment, the memory cells may be triple level cells (TLCs) each storing 3-bit data. However, the present disclosure is not limited thereto, and in other embodiments, some of the memory cells included in the memory cell array 110 may be single level cells (SLCs) each storing 1-bit data, and other memory cells may be MLCs.

The memory cell array 110 may be connected to a plurality of word lines and a plurality of bit lines, and may perform programming on a selected memory cell to be programmed by using the plurality of word lines and the plurality of bit lines. Hereinafter, a word line connected to a selected memory cell to be programmed is referred to as a selected word line, and a word line adjacent to the selected word line (for example, a word line located directly under or on the selected word line) is referred to as an adjacent word line.

The control logic 120 may generally control various operations of the nonvolatile memory device 10 based on the program command CMD and the address ADDR received from the memory controller 20. For example, the control logic 120 may output various control signals used for programming data on the memory cell array 110 or reading data from the memory cell array 110. Also, the control logic 120 may output control signals used for performing a programming operation and a verification operation on the selected word line to various functional blocks included in the nonvolatile memory device 10. According to the present disclosure, the control logic 120 may read the adjacent word line before the verifying operation on the selected word line, and provide a result of the reading of the adjacent word line to the verify manager 121. In an embodiment, the result of reading may include a program state of the adjacent word line. In another embodiment, the control logic 120 may read the memory cell connected to the adjacent word lines by using the reference voltage, and depending on a state of the memory cell, a result of reading the memory cell may include '0' or '1'.

In an embodiment where memory cells included in the memory cell array 110 are MLCs, the adjacent word line may be programmed to be one of an erase state E, a first program state P1, a second program state P2, and a third program state P3 in an order in which a threshold voltage increases. When the adjacent word line is programmed to be in a state in which a threshold voltage is relatively low (for example, the erase state E or the first program state P1), compared to a state in which a threshold voltage is relatively high (for example, the second program state P2 or the third program state P3), there may be a larger gap between the threshold voltages of the memory cell connected to the selected word line SelWL and the memory cell connected to the adjacent word line. Accordingly, charge loss with respect to the memory cell connected to the selected word line may increase.

The nonvolatile memory device of the disclosure 10 may improve retention of the memory cell connected to the selected word line by reading the adjacent word line and controlling verifying conditions to be different based on the results of reading.

Hereinafter, a state in which a threshold voltage is programmed to be relatively low (for example, the erase state E or the first program state P1) is referred to as a low-level program state, and a state in which a threshold voltage is programmed to be relatively high (for example, the second program state P2 or the third program state P3) is referred to as a high-level program state. The above-mentioned example is merely one of various examples, and it may be understood that a standard for defining the low-level programming state and the high-level programming state may be set variously.

The verify manager 121 may control the verifying conditions based on the result of reading the adjacent word line. When the adjacent word line is in the low-level program state, the verify manager 121 may control charge sharing of a sensing node in a verifying operation on the selected word line. Accordingly, dispersion of the memory cells connected to the selected word line may move in a direction of a higher voltage. Details thereabout will be described in FIG. 13.

In an embodiment, the verify manager 121 may control sensing time for the sensing node as one of the verifying conditions based on the result of reading the adjacent word line. In another embodiment, the verify manager 121 may control a verifying voltage level as one of the verifying conditions based on the result of reading the adjacent word line. Details thereabout will be described in FIGS. 14 and 15.

The operation of the nonvolatile memory device 10 when the memory cells are MLCs is described in the specification. However, it is merely one of various embodiments, and it may be understood that the embodiment may be analogically applied when the memory cells are SLCs, TLCs or quadruple level cells (QLCs).

Figure 2:
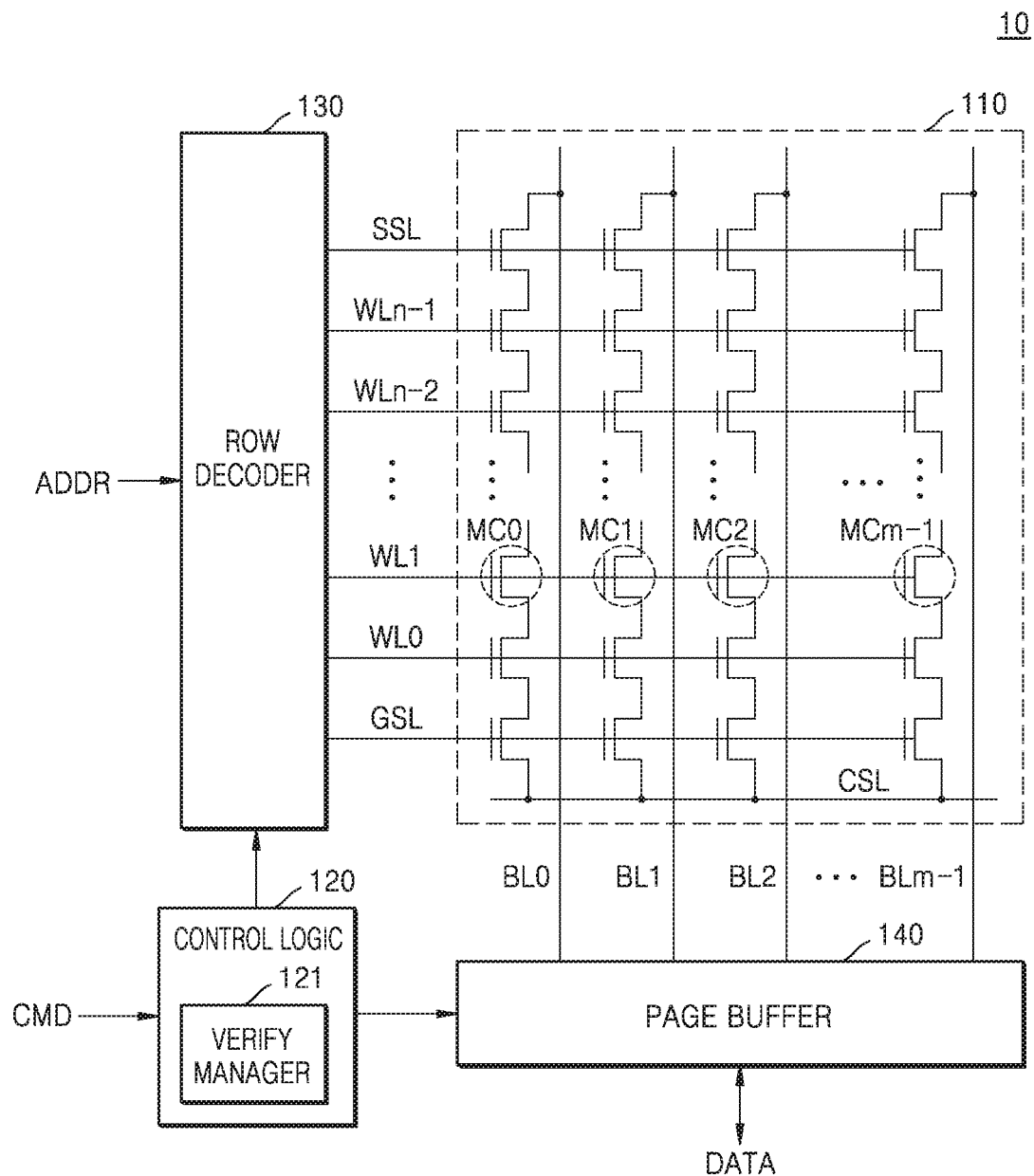
FIG. 2 is a block diagram illustrating a nonvolatile memory device according to an embodiment of the disclosure.

FIG. 2 is a block diagram illustrating the nonvolatile memory device 10 according to an embodiment of the disclosure. Description about components overlapping with those of FIG. 1 may be omitted.

With reference to FIG. 2, the nonvolatile memory device 10 may include the memory cell array 110, the control logic 120, a row decoder 130, and a page buffer 140. Also, the control logic 120 may include the verify manager 121. In the drawing, illustratively, the nonvolatile memory device 10 is a flash memory device. However, it may be understood that the disclosure is not limited to be applied to a flash memory device but may also be applied to all types of nonvolatile memory devices (for example, ROM, PROM, EEPROM, a flash memory device, PRAM, MRAM, RRAM, FRAM, and so on).

The memory cell array 110 may be connected to the row decoder 130 by word lines WL0 through WLn−1, a string selection line SSL, and a ground selection line GSL. The memory cell array 110 may be connected to the page buffer 140 by bit lines BL0 through BLm−1. The memory cell array 110 may include a plurality of NAND cell strings. Each of the NAND cell strings may be connected to a corresponding one of the bit lines BL0 through BLm−1 through a string selection transistor SST to be described in FIG. 4. The memory cell array 110 may include planes each including a plurality of memory blocks, and each of the plurality of memory blocks may include a plurality of pages. Each of the plurality of pages may include a plurality of memory cells (e.g., MC0 through MCm−1). The memory cell array 110 will be described in more detail with reference to FIGS. 4 through 6.

The page buffer 140 may operate as a write driver or a sense amplifier depending on operation modes. In a writing operation, the page buffer 140 may transfer a bit line voltage corresponding to data to be written on the bit lines BL0 through BLm−1 in the memory cell array 110. In a reading operation, the page buffer 140 may detect data stored in the memory cell selected under control of a bit line sensing signal through the bit line connected to the sensing node. The page buffer 140 may latch the detected data and output the data to the outside.

The control logic 120 may output various control signals to control the page buffer 140 and the row decoder 130 to perform programming operations in response to the program command CMD. According to the disclosure, the control logic 120 may output various control signals to the page buffer 140 and the row decoder 130 so as to read the adjacent word line before performing the verifying operation, and the verify manager 121 may receive the result of the reading operations. By using the method described in FIG. 1, the verify manager 121 may determine whether to change the verifying conditions based on the result of the reading operation, and in an embodiment, the control logic 120 may control the verifying conditions by changing sensing time with respect to the page buffer 140 in response to the determination of the verify manager 121 to change the verifying condition. In another embodiment, the control logic 120 may control the verifying conditions by changing a verifying voltage level with respect to the row decoder 130 and a voltage generator (not shown) connected thereto in response to the determination of the verify manager 121 to change the verifying condition.

The row decoder 130 may select one of the memory blocks included in the memory cell array 110 in response to the address ADDR. The row decoder 130 may select a selected word line from the word lines of the memory block. The row decoder 130 may transmit a word line voltage (for example, a program voltage, a verifying voltage, a pass voltage) from the voltage generator (not shown) of the selected memory block to the word lines of the selected memory block.

Figure 3:
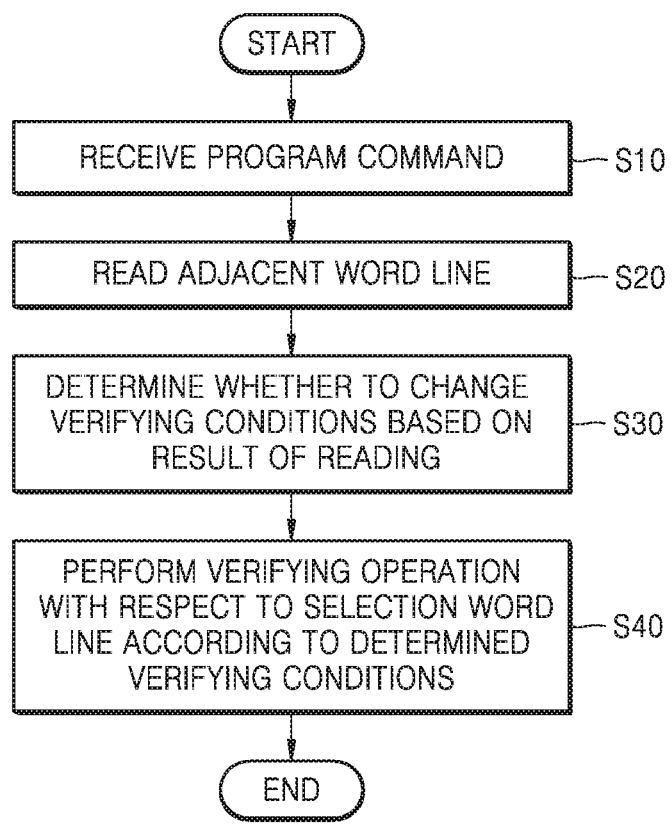
FIG. 3 is a flowchart illustrating an operation method of the nonvolatile memory device according to an embodiment of the disclosure.

FIG. 3 is a flowchart illustrating an operation method of the nonvolatile memory device 10 according to an embodiment of the disclosure.

With reference to FIGS. 1 and 3, the nonvolatile memory device 10 may receive the program command CMD from the memory controller 20 (S10). The nonvolatile memory device 10 may read the adjacent word line (S20). The nonvolatile memory device 10 may perform a programming operation corresponding to the program command CMD, and in an embodiment, the nonvolatile memory device 10 may read the adjacent word line before performing the programming operation. In another embodiment, the nonvolatile memory device 10 may read the adjacent word line after performing the programming operation.

The nonvolatile memory device 10 may determine whether to change the verifying conditions based on the result of the reading operation (S30). In an embodiment, when the memory cell connected to the adjacent word line is in a program state having a lower voltage level than a voltage level of a predetermined first reference program state, the nonvolatile memory device 10 may change the verifying conditions, and when the memory cell connected to the word line is not in a program state having a lower voltage level than the voltage level of the predetermined first reference program state, the nonvolatile memory device 10 may not change the verifying conditions. In an example using MLCs, the first reference program state may include any one of an erase state E, a first program state P1, a second program state P2, and a third program state P3.

In an embodiment, the nonvolatile memory device 10 may read the adjacent word line by using a first voltage. In addition, when a threshold voltage of a memory cell connected to the adjacent word line is equal to or lower than the first voltage, the nonvolatile memory device 10 may change the verifying conditions, and when the threshold voltage of the memory cell connected to the adjacent word line is not equal to or lower than the first voltage, the nonvolatile memory device 10 may not change the verifying conditions.

In an embodiment, when a gap between a program state of the memory cell connected to the selected word line and a program state of the memory cell connected to the adjacent word line is equal to or greater than the reference value, the nonvolatile memory device 10 may change the verifying conditions, and when the gap is not equal to or greater than the reference value, the nonvolatile memory device 10 may not change the verifying conditions.

The nonvolatile memory device 10 may verify the selected word line according to the determined verifying conditions (S40). In an embodiment, the nonvolatile memory device 10 may control sensing time for the sensing node based on the result of the reading operation. In an embodiment, the nonvolatile memory device 10 may control the verifying voltage level based on the result of reading.

Figure 4:
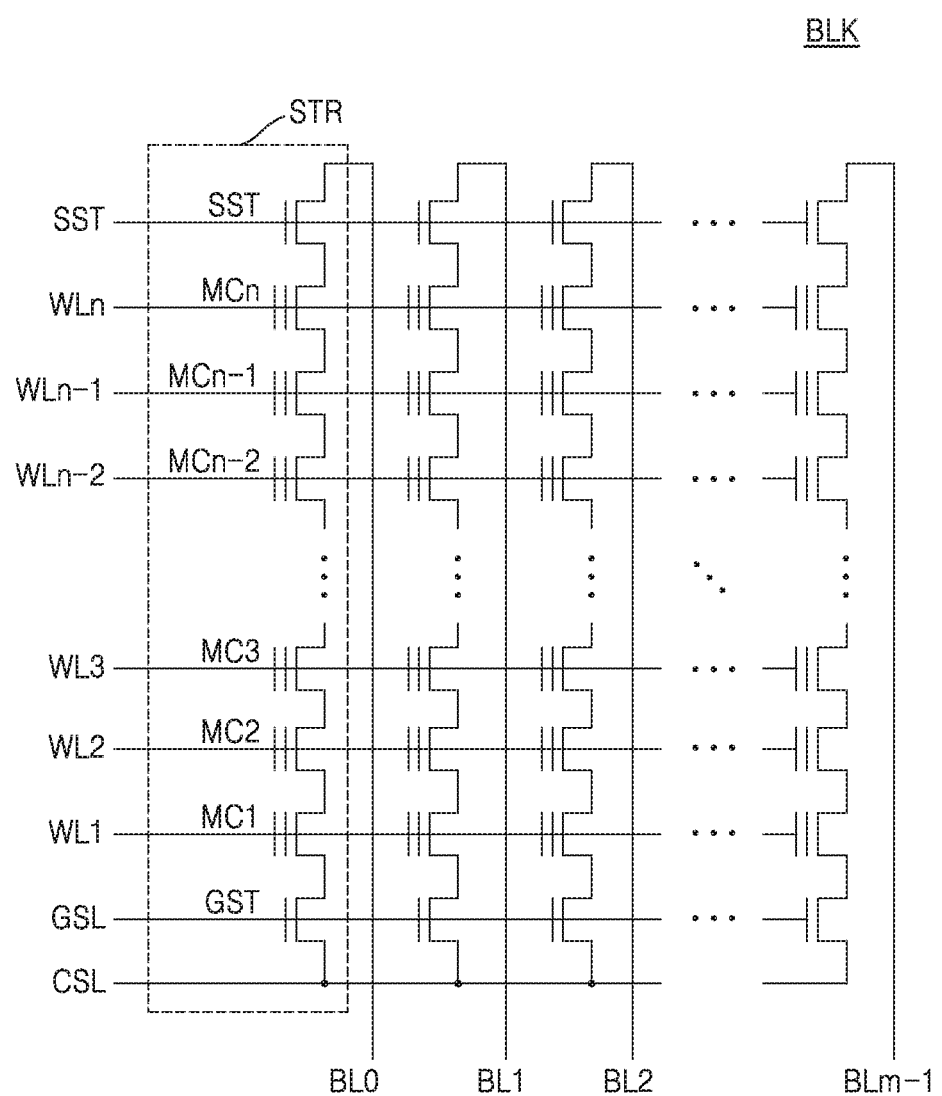
FIG. 4 is a circuit diagram illustrating memory blocks included in a memory cell array according to an embodiment of the disclosure.

FIG. 4 is a circuit diagram illustrating one of the memory blocks included in the memory cell array according to an embodiment of the disclosure.

With reference to FIG. 4, the memory cell array (for example, 110 in FIG. 2) may be a memory cell array included in a horizontal NAND flash memory, and may include a plurality of memory blocks BLK. Each of the memory blocks BLK may include m cell strings STR (m is an integer equal to or greater than 2) that are made by serially connecting a plurality of memory cells MC in a direction of each of bit lines BL0 to BLm−1. For example, an embodiment in which each of the cell strings STR includes n memory cells is illustrated in FIG. 4 (n is an integer equal to or greater than 2).

An erase operation is performed in block units on the NAND flash memory device having a structure identical to FIG. 4, and a programming operation is performed in units of pages corresponding to each word line WL1 through WLn. FIG. 4 illustrates an embodiment in which n pages with respect to n word lines WL1 through WLn are provided in one block. The nonvolatile memory 10 may operate a selected word line connected to a memory cell to be programmed in the programming operation and the verifying operation. In an embodiment, when a programming operation is performed on a third memory cell MC3, a third word line WL3 may be a selected word line. In the embodiment, a second word line WL2 may be an adjacent word line. Each cell string STR may include serial connections of memory cells MC1 through MCn controlled by word lines WL1 through WLn, a string selection transistor SST controlled by a string selection line SSL, and a ground selection transistor GST controlled by a ground selection line GSL. All of the cell strings STR may be connected to a common source line CSL through the ground selection transistor GST. The nonvolatile memory device 10 of FIGS. 1 and 2 may include a plurality of memory cell arrays with a structure and an operation identical to the memory cell array 110 described above.

Figure 5:
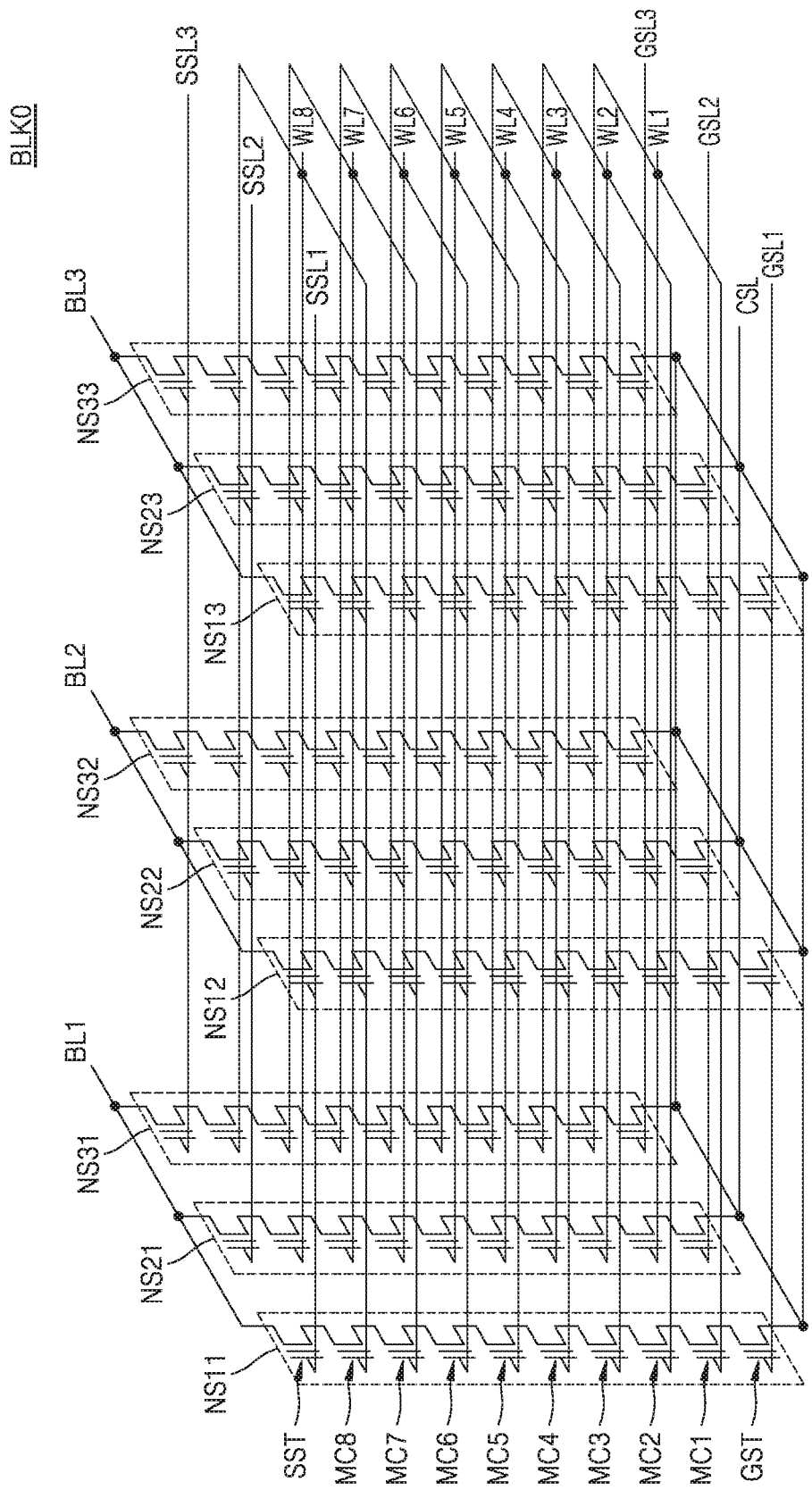
FIG. 5 is a circuit diagram illustrating another example of memory blocks included in the memory cell array according to embodiments of the disclosure.

FIG. 5 is a circuit diagram illustrating another example of the memory blocks included in the memory cell array according to an embodiment of the disclosure.

With reference to FIG. 5, the memory cell array (for example, 110 in FIG. 2) may be a memory cell array of a vertical NAND flash memory, and may include a plurality of memory blocks. Each of the memory blocks BLK0 may include a plurality of NAND cell strings NS11 through NS33, a plurality of word lines WL1 through WL 8, a plurality of bit lines BL1 through BL3, a plurality of ground selection lines GSL1 through GSL3, a plurality of cell string selection lines SSL1 through SSL3, and a common source line CSL. In this case, the number of NAND cell strings, the number of word lines, the number of bit lines, the number of ground selection lines and the number of cell string selection lines may be changed variously according to embodiments.

The NAND cell strings NS11, NS21, and NS31 are provided between a first bit line BL1 and the common source line CSL, the NAND cell strings NS12, NS22, and NS32 are provided between a second bit line BL2 and the common source line CSL, and the NAND cell strings NS13, NS23, and NS33 are provided between a third bit line BL3 and the common source line CSL. Each of the NAND cell strings (for example, NS11) may include a cell string selection transistor SST, a plurality of memory cells M1 through M8, and a ground selection transistor GST that are serially connected.

Cell strings connected to one same bit line are included in one same column. For example, the cell strings NS11, NS21, and NS31 connected to the first bit line BL1 may correspond to a first column, the cell strings NS12, NS22, and NS32 connected to the second bit line BL2 may correspond to a second column, and the cell strings NS13, NS23, and NS33 connected to the third bit line BL3 may correspond to a third column.

Cell strings connected to one same cell string selection line SSL are included in one same row. For example, the cell strings NS11, NS12, and NS13 connected to a first cell string selection line SSL1 may correspond to a first row, the cell strings NS21, NS22, and NS23 connected to a second cell string line SSL2 may correspond to a second row, and the cell strings NS31, NS32, and NS33 connected to a third cell string line SSL3 may correspond to a third row.

The cell string selection transistor SST is connected to corresponding cell string selection lines SSL1 through SSL3. The plurality of memory cells MC1 through MC8 are respectively connected to corresponding word lines WL1 through WL8. The ground selection transistor GST is connected to corresponding ground selection lines GSL1 through GSL3. The cell string selection transistor SST is connected to the corresponding bit lines BL1 through BL3, and the ground selection transistor GST is connected to the common source line CSL.

The word lines having identical heights (for example, WL1) are connected to one another, the cell string selection lines SSL1 through SSL3 are separated from one another, and the ground selection lines GSL1 through GSL3 are separated from one another. For example, when the memory cells connected to the first word line WL1 and included in the cell strings NS11, NS12, and NS13 are programmed, the first word line WL1 and the first cell string selection line SSL are selected. The ground selection lines GSL1 through GSL3 may be connected to one another.

Figure 6:
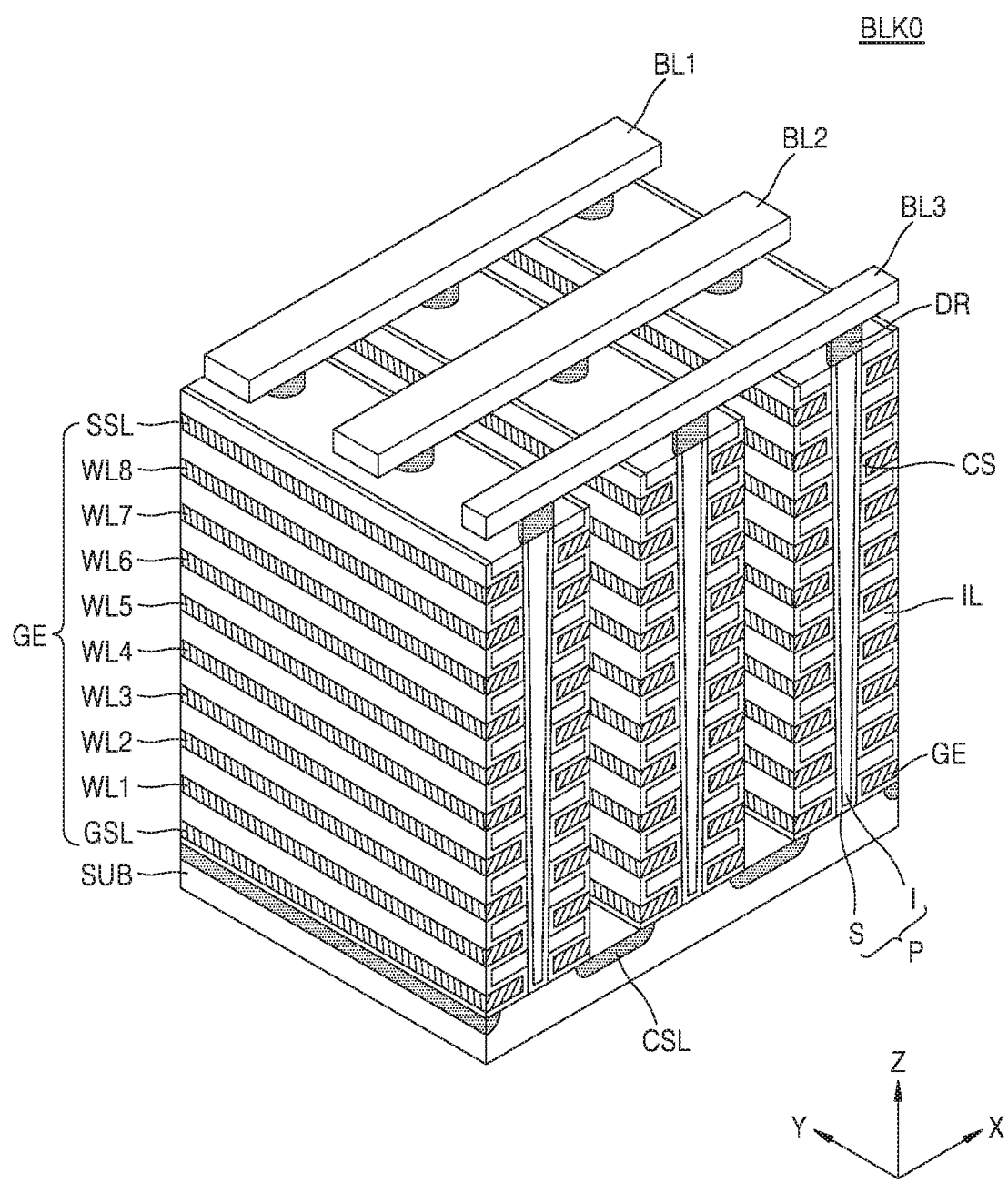
FIG. 6 is a perspective view illustrating the memory blocks of FIG. 5.

FIG. 6 is a perspective view illustrating the memory block BLK0 in FIG. 5.

With reference to FIG. 6, each of the memory blocks included in the memory cell array (for example, 110 in FIG. 2) is formed to be perpendicular to a substrate SUB. Although the memory block BLK0 is illustrated as including two selection lines GSL and SSL, eight word lines WL1 through WL8, and three bit lines BL1 through BL3 in FIG. 6, the memory block BLK0 may actually include more or less components.

The substrate SUB is a first conductivity type (for example, p type), and common source lines CSL extending (there are more like this) in a first direction (for example, the Y direction) and doped with second conductivity type (for example, n type) impurities are provided on the substrate SUB. A plurality of insulating layers IL elongated in the first direction are sequentially provided in a third direction (for example, the Z direction) on regions of the substrate SUB between two of the common source lines CSL, and the plurality of insulating layers IL are separated at predetermined intervals in the third direction. The plurality of insulating layers IL, for example, may include insulating materials such as silicon oxide.

A plurality of pillars P sequentially arranged in the first direction and penetrating the plurality of insulating layers IL in the third direction are provided on the regions of the substrate SUB between two of the common source lines CSL. For example, the plurality of pillars P may penetrate through the plurality of insulating layers IL and contact the substrate SUB. More particularly, a surface layer S of each pillar P may include silicon materials of the first type and function as a channel region. An inner layer I in each of the pillars P may include insulating materials such as silicon oxide or an air gap.

Charge storage layers CS are provided along exposed surfaces of the insulating layers IL, the pillars P, and the substrate SUB in the regions of two adjacent common source lines CSL. Each of the charge storage layers CS may include a gate insulating layer (which may also be referred to as "a tunneling insulating layer"), a charge trapping layer, and a blocking insulating layer. For example, the charge storage layer CS may have an oxide-nitride-oxide (ONO) structure. Also, gate electrodes GE such as the selection lines GSL, SSL, and the word lines WL1 through WL8 are provided on exposed surfaces of the charge storage layers CS in the regions of two adjacent common source lines CSL.

Drains or drain contacts DR are respectively provided on the plurality of pillars P. For example, the drains or drain contacts DR may include silicon materials doped with impurities of second conductive types. The bit lines BL1 through BL3 extending in a second direction (for example, the X direction) and separately arranged at predetermined intervals in the first direction are provided on the drains or drain contacts DR.

Figure 7:
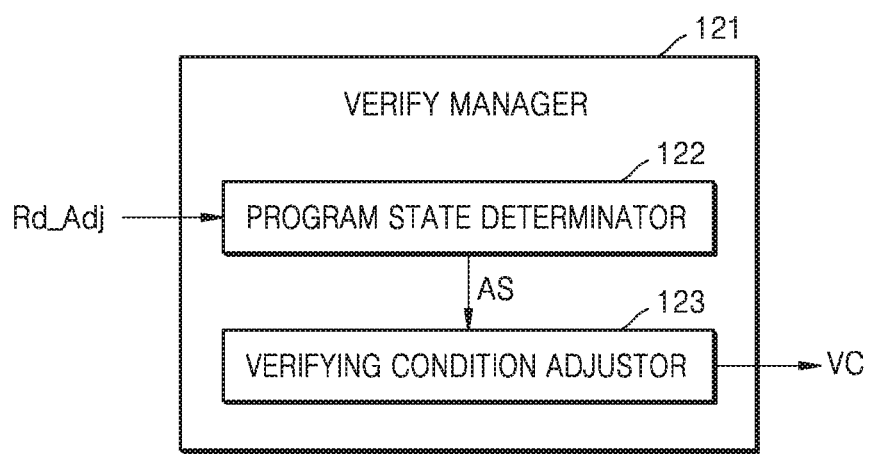
FIG. 7 is a block diagram illustrating a verification manager according to an embodiment of the disclosure.

FIG. 7 is a block diagram illustrating the verify manager 121 according to an embodiment of the disclosure.

With reference to FIGS. 1 and 7, the verify manager 121 may include a program state determinator 122 and a verifying condition adjustor 123. The program state determinator 122 may receive the result of reading with respect to the adjacent word line Rd_Adj and determine a program state of the adjacent word line Rd_Adj. Also, the program state determinator 122 may determine whether to adjust the verifying conditions based on the determined program state.

In an embodiment, the program state determinator 122 may determine a program state of the adjacent word line to be one of the erase state E, the first program state P1, the second program state P2, and the third program state P3, and when the program state of the adjacent word line is equal to or lower than the predetermined first reference program state, the program state determinator 122 may output '1' as an adjustment signal AS to the verifying condition adjustor 123, and when the voltage of the program state of the adjacent word line is not equal to or lower than the voltage of the predetermined first reference program state, the program state determinator 122 may output '0' as an adjustment signal AS to the verifying condition adjustor 123.

In an embodiment, the program state determinator 122 may determine a program state of the adjacent word line to be one of 'ON' (or '1') or 'OFF' (or '0') according to the reference voltage, and when the program state of the adjacent word line is 'ON', the program state determinator 122 may output '1' as an adjustment signal AS to the verifying condition adjustor 123, and when the program state of the adjacent word line is 'OFF', the program state determinator 122 may output '0' as an adjustment signal AS to the verifying condition adjustor 123.

In an embodiment, the program state determinator 122 may further receive a program state of the selected word line from the control logic 120. The program state determinator 122 may determine a program state of the adjacent word line and the selected word line to be one of the erase state E, the first program state P1, the second program state P2, and the third program state P3, and when a gap between the program state of the selected word line and the program state of the adjacent word line is equal to or higher than the reference value, the program state determinator 122 may output '1' as an adjustment signal AS to the verifying condition adjustor 123, and when the gap between the program state of the selected word line and the program state of the adjacent word line is not equal to or higher than the reference value, the program state determinator 122 may output '0' as an adjustment signal AS to the verifying condition adjustor 123.

The verifying condition adjustor 123 may change the verifying conditions by outputting a verifying condition change signal VC to the control logic 120 in response to the adjustment signal AS received from the program state determinator 122. In an embodiment, the verifying condition adjustor 123 may output the verifying condition change signal VC to change the sensing time. In an embodiment, the verifying condition adjustor 123 may output the verifying condition change signal VC to change the verifying voltage level.

Figure 8A:
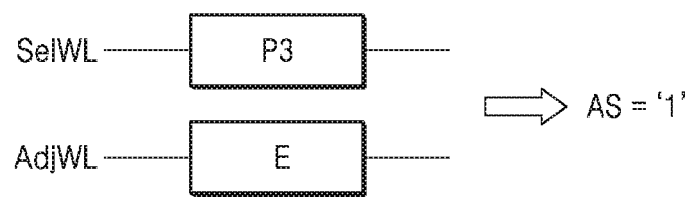
FIGS. 8A and 8B are exemplary drawings illustrating operations of a program state determinator according to an embodiment of the disclosure.
Figure 8B:
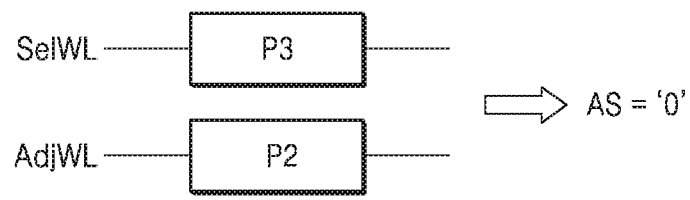

FIGS. 8A and 8B are examples illustrating operations of the program state determinator 122 according to an embodiment of the disclosure. More particularly, FIGS. 8A and 8B illustrate examples in which the program state determinator 122 determines whether to adjust the verifying conditions by comparing the program state of the adjacent word line AdjWL to a predetermined first program state. Also, in the examples illustrated in FIGS. 8A and 8B, the first reference program state may be the first program state P1.

With respect to FIGS. 7 and 8A, a program state of the selected word line SelWL may be the third program state P3, and a program state of the adjacent word line AdjWL may be the erase state E. The program state determinator 122 may receive the erase state E (or a binary number corresponding thereto, for example '11') as a result of reading Rd_Adj with respect to the adjacent word line AdjWL and may compare the erase state E to the first program state P1, that is, the first reference program state. As a threshold voltage in the erase state E is lower than a threshold voltage in the first program state P1, the program state determinator 122 may output '1' as an adjustment signal AS.

With reference to FIGS. 7 and 8B, a program state of the selected word line SelWL may be the third program state P3, and a program state of the adjacent word line AdjWL may be the second program state P2. The program state determinator 122 may receive the second program state P2 (or a binary number corresponding thereto, for example '00') as a result of reading Rd_Adj with respect to the adjacent word line AdjWL and compare the second program state P2 to the first program state P1, that is, the first reference program state. As a threshold voltage in the second program state P2 is higher than a threshold voltage in the first program P1, the program state determinator 122 may output '0' as an adjustment signal AS.

An example in which a reference value is "two steps" (or a natural number corresponding thereto, for example '2') will be described hereinafter.

In the example of FIG. 8A, the program state determinator 122 may receive the erase state E (or a binary number corresponding thereto, for example '11') as a result of reading Rd_Adj with respect to the adjacent word line AdjWL, and may determine a differential value between the third program state P3, which is a program state of the selected word line SelWL, and the erase state E, which is a program state of the adjacent word line AdjWL to be "three steps" (or a natural number '3' corresponding thereto). As the differential value "three steps" is equal to or greater than the reference number "two steps", the program state determinator 122 may output '1' as an adjustment signal AS.

In an example in FIG. 8B, the program state determinator 122 may receive the second program state P2 (or a binary number corresponding thereto, for example '00') as the result of reading Rd_Adj with respect to the adjacent word line AdjWL, and may determine a differential value between the third program state P3, which is the program state of the selected word line SelWL, and the second program state P2, which is the program state of the adjacent word line AdjWL, to be "one step" (or a natural number '1' corresponding thereto). As the differential value "one step" is not equal to or higher than the reference value "two steps", the program state determinator 122 may output '0' as an adjustment signal AS.

Figure 9A:
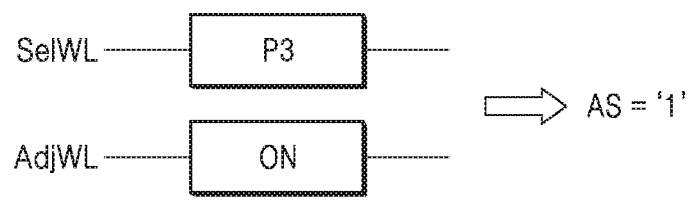
FIGS. 9A and 9B are exemplary drawings illustrating the operations of the program state determinator according to an embodiment of the disclosure.
Figure 9B:
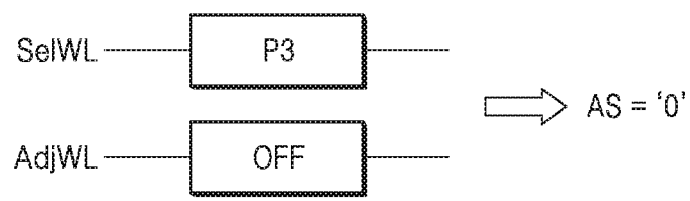

FIGS. 9A and 9B are examples illustrating operations of the program state determinator 122 according to an embodiment of the disclosure. More particularly, FIGS. 9A and 9B illustrate examples in which the program state determinator 122 determines whether to adjust the verifying conditions based on the result of reading Rd_Adj by using a reference voltage.

With reference to FIGS. 7 and 9A, a program state of the selected word line SelWL may be the third program state P3, and a result of reading Rd_Adj with respect to the adjacent word line AdjWL may be 'ON'. The program state determinator 122 may receive 'ON' (or a binary number corresponding thereto, for example, '1') as the result of reading Rd_Adj with respect to the adjacent word line AdjWL and may correspondingly output '1' as an adjustment signal AS.

With reference to FIGS. 7 and 9B, a program state of the selected word line SelWL may be the third program state P3, and a result of reading Rd_Adj with respect to the adjacent word line AdjWL by using the reference voltage may be 'OFF'. The program state determinator 122 may receive 'OFF' (or a binary number corresponding thereto, for example, '0') as the result of reading Rd_Adj with respect to the adjacent word line AdjWL, and may correspondingly output '0' as an adjustment signal AS.

Figure 10:
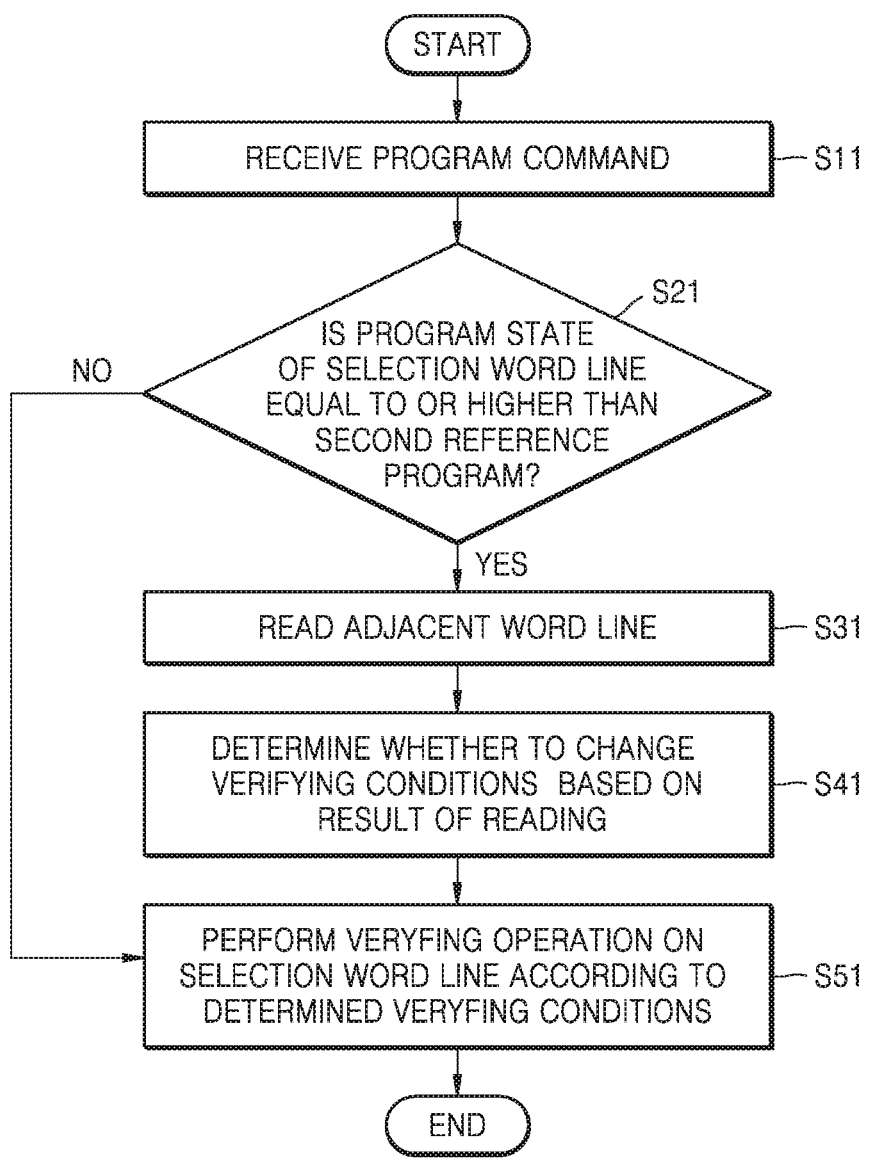
FIG. 10 is a flowchart illustrating an operation method of the nonvolatile memory device according to an embodiment of the disclosure.

FIG. 10 is a flowchart illustrating an operation of the nonvolatile memory device 10 according to an embodiment of the disclosure. Descriptions overlapping with those of FIG. 3 will be omitted.

With reference to FIGS. 1 and 10, the nonvolatile memory device 10 may receive the program command CMD from the memory controller 20 (S11). The nonvolatile memory device 10 may check whether a program state of the selected word line is equal to or higher than a predetermined second reference program state (S21). In an example of MLCs, the second reference program state may be one of the erase state E, the first program state P1, the second program state P2, and the third program state P3. When the program state of the selected word line is equal to or higher than the second reference program state, the nonvolatile memory device 10 may read the adjacent word line (S31). The nonvolatile memory device 10 may determine whether to change the verifying conditions based on the result from the reading operation (S41). The nonvolatile memory device 10 may verify the selected word line according to the determined verifying conditions (S51).

When the program state of the selected word line SelWL is not equal to or higher than the first reference program state, the nonvolatile memory 10 may perform a verifying operation on the adjacent word line (S31) according to the determined verification conditions (SM) instead of performing a reading operation and changing the verifying conditions (S41). In this case, the determined verifying conditions may be reference verifying conditions on which the changing of the verifying conditions is not performed.

Figure 11A:
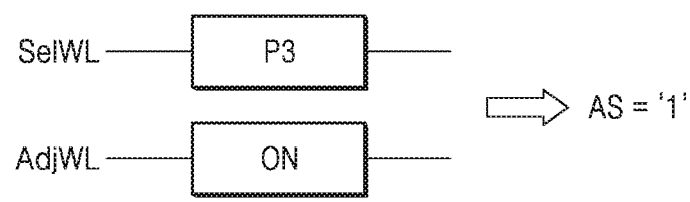
FIGS. 11A and 11B are exemplary drawings illustrating operations of the program state determinator according to an embodiment of the disclosure.
Figure 11B:
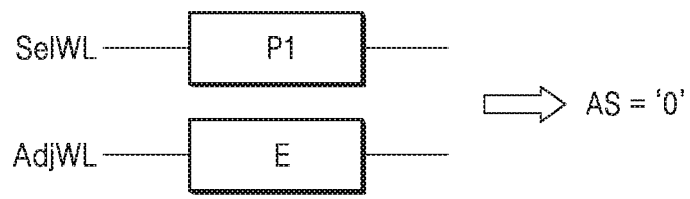

FIGS. 11A and 11B are exemplary drawings illustrating operations of the program state determinator according to an embodiment of the disclosure. More particularly, FIGS. 11A and 11B are examples illustrating embodiments in which the program state determinator 122 determines whether to adjust the verifying conditions based on the program state of the selected word line. Also, FIGS. 11A and 11B illustrate an example in which the second reference program state of the selected word line is the second program state P2.

With reference FIGS. 7 and 11A, a program state of the selected word line SelWL may be the third program state P3, and a program state of the adjacent word line AdjWL may be the erase state E. As the third program state P3, which is the program state of the selected word line SelWL, has a higher threshold voltage than the second program state P2, which is the first reference program state, the program state determinator 122 may adjust the verifying conditions upon considering the program state of the adjacent word line AdjWL.

With reference to FIGS. 7 and 11B, a program state of the selected word line SelWL may be the first program state P1, and a program state of the adjacent word line AdjWL may be the erase state E. As the first program state P1, which is the program state of the selected word line SelWL, has a lower threshold voltage than the second program state P2, which is the first reference program state, the program state determinator 122 may not adjust the verifying conditions.

Figure 12:
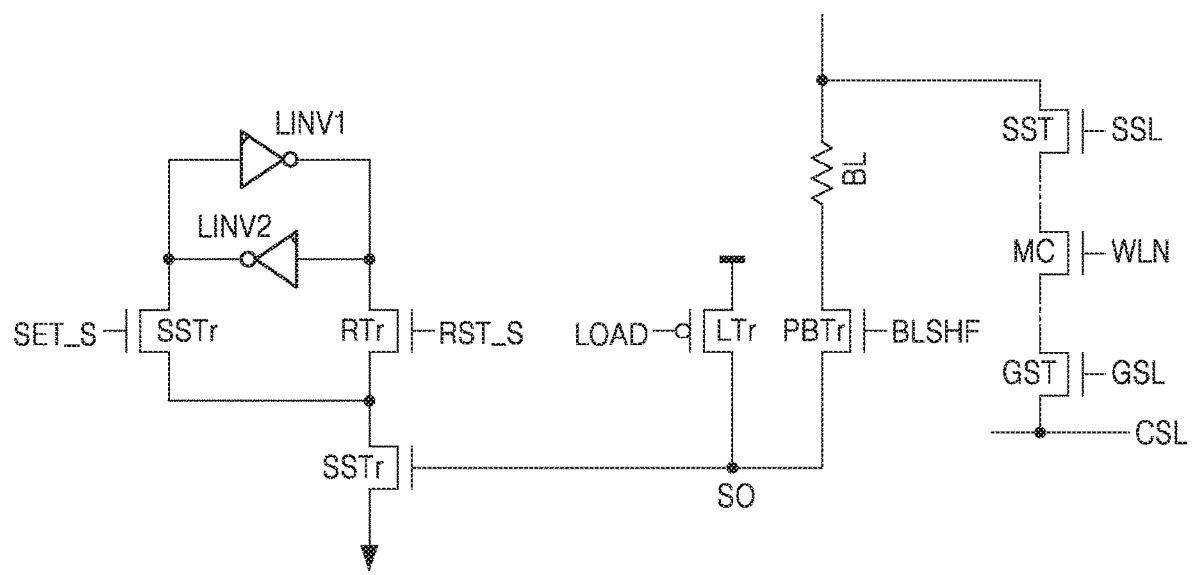
FIG. 12 is a circuit diagram schematically illustrating a part of the nonvolatile memory device.

FIG. 12 is a circuit diagram schematically illustrating a part of the nonvolatile memory device 10.

With reference to FIG. 12, the nonvolatile memory device 10 may include a page buffer transistor PBTr, a load transistor LTr, a set transistor STr, a reset transistor RTr, a sensing transistor SSTr, a string selection transistor SST, a plurality of memory cells MC, a ground selection transistor GST, a bit line BL and a sensing latch including first and second latch inverters LINV1 and LINV2. As the string selection transistor SST, the plurality of memory cells MC and the ground selection transistors GST have been described in detail in FIG. 5, further descriptions will be omitted. The bit line BL is illustrated as an equivalent resistance generated due to self-resistances of leading wires.

In general, a sensing operation on the memory cells MC in the nonvolatile memory device 10 may include initializing, precharging, BL development, SO development and sensing.

In the initializing operation, the set transistor STr will be on as a set signal SET_S is shifted to logic high, and thus, the sensing latch may be initialized. In the precharging operation, based on a load signal LOAD, the load transistor LTr is shifted to an ON state, and a voltage level of the bit line sensing signal BLSHF is shifted to a first voltage level, and thus, the bit line BL may be precharged to the first voltage level. When the verifying operation is performed, the first voltage level may be the verifying voltage.

In the BL development operation, the load transistor LTr is shifted to an OFF state, the precharge operation to the bit line BL is finished, and the bit line sensing signal BLSHF may be shifted to logic low (for example, 0V). And as the ground selection transistor GST is shifted to an ON condition, the bit line BL may be developed due to a cell current generated by the memory cell MC.

In the SO development operation, in which a voltage on a sensing node SO is developed, a second voltage lower than the first voltage level may be applied as the bit line sensing signal BLSHF, and accordingly, when the memory cell MC is in an ON state, a voltage level of the bit line BL may be lower than when the memory cell is in an OFF state. Also, in the sensing operation, the reset transistor signal RST_S is shifted to an ON state, and depending on whether the sensing latch flips or not, it may be sensed whether the memory cell MC is in an ON state or an OFF state.

Figure 13A:
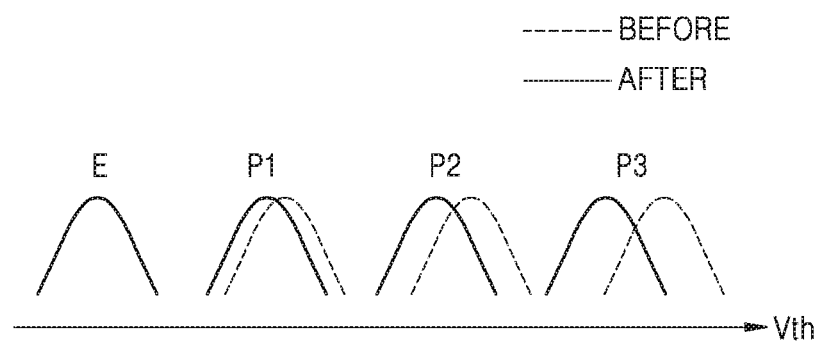
FIGS. 13A and 13B are drawings illustrating degrees of dispersion of memory cells connected to selected word lines according to an embodiment of the disclosure.
Figure 13B:
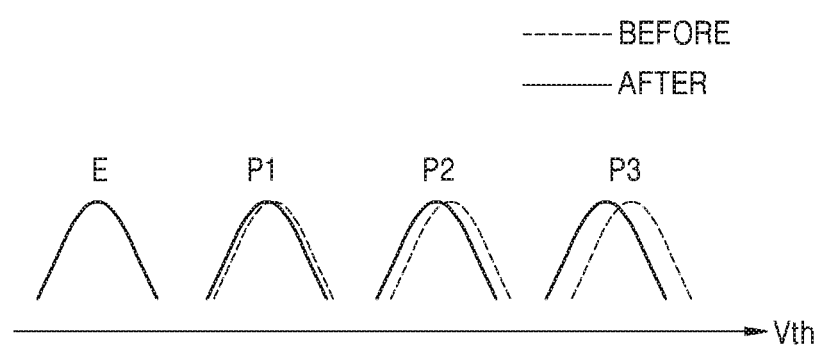

FIGS. 13A and 13B are diagrams illustrating degrees of dispersion of the memory cells connected to the selected word line SelWL according to an embodiment of the disclosure. FIG. 13A illustrates a case in which the adjacent word line AdjWL is in a low-level program state (for example, the erase state E), and FIG. 13B illustrates a case in which the adjacent word line AdjWL is in a high-level program state (for example, the second program state P2).

With reference to dotted line graphs in FIG. 13A, as the adjacent word line AdjWL is in the low-level program state in the verifying operation after the programming operation, the nonvolatile memory device 10 may form a higher level of cell dispersion with respect to the memory cells MC by changing the verifying conditions. After a predetermined period, relatively great charge loss may be caused due to different levels of the threshold voltages between the adjacent word line AdjWL and the selected word line SelWL, and the degrees of dispersion may make larger movements to the left (that is, in a direction of a low voltage) than in FIG. 13B, and may be formed like full line graphs.

With reference to dotted line graphs in FIG. 13B, as the adjacent word line AdjWL is in the high-level program state in the verifying operation after the programming operation, the nonvolatile memory device 10 may not change the verifying conditions. After a predetermined period, charge loss caused due to differences of threshold voltage levels in the adjacent word line AdjWL and the selected word line SelWL may decrease, and the degrees of dispersion of the memory cells MC may move to the left (that is, in a direction of a low voltage) less than in FIG. 13A and may be illustrated like full line graphs.

As described above, verifying operations are performed under various conditions depending on the program state of the adjacent word line AdjWL, gaps between the degrees of dispersion of the memory cells may be relatively small, and retention problems may be improved.

Figure 14A:
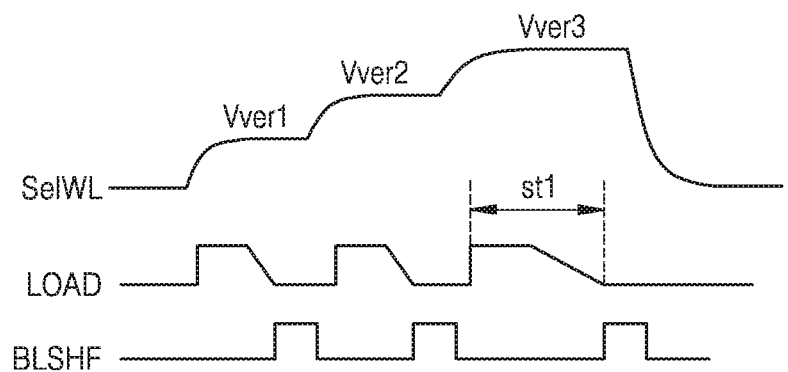
FIGS. 14A and 14B are timing diagrams illustrating verifying operations according to an embodiment of the disclosure.
Figure 14B:
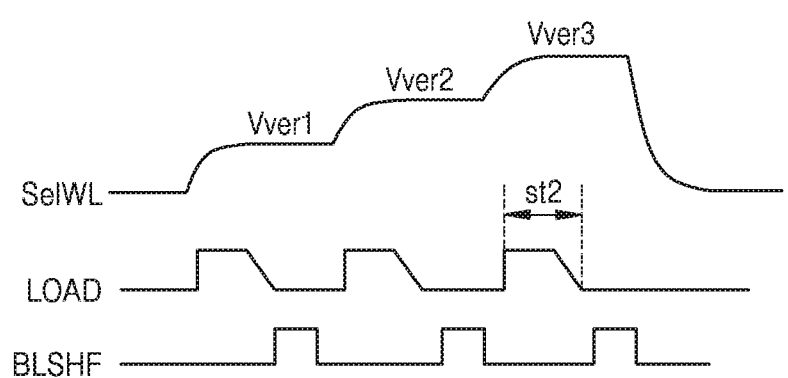

FIGS. 14A and 14B are timing charts illustrating the verifying operations according to an embodiment of the disclosure. More particularly, FIGS. 14A and 14B illustrate embodiments in which the nonvolatile memory device 10 adjusts a sensing time as one of the verifying conditions.

With reference to FIGS. 12, 13, 14A and 14B, FIG. 14A illustrates an embodiment corresponding to FIG. 13A in which the adjacent word line AdjWL is in the low-level program state, FIG. 14B illustrates an embodiment corresponding to FIG. 13B in which the adjacent word line AdjWL is in the high-level program state. With reference to FIG. 14A, first through third verifying voltages Vver1 through Vver3 may be sequentially applied to the selected word line SelWL in order to perform the verifying operation. When the adjacent word line is in the low-level program state, the nonvolatile memory device 10 may set a sensing time as a first sensing time st1. Also, with reference to FIG. 14B, the first through third verifying voltages may be sequentially applied to the selected word line SelWL so as to perform the verifying operations. When the adjacent word line is in the high-level program state, the nonvolatile memory device 10 may set a sensing time as a second sensing time st2.

According to an embodiment of the disclosure, the first sensing time st1 may be longer than the second sensing time st2. In other words, when the adjacent word line AdjWL is in the low-level program state, the nonvolatile memory device 10 may perform more charge sharing on the sensing node S0 by setting a long sensing time. Accordingly, a dispersion of the memory cells connected to the selected word line SelWL may be formed relatively on the right (that is, a high voltage).

Figure 15A:
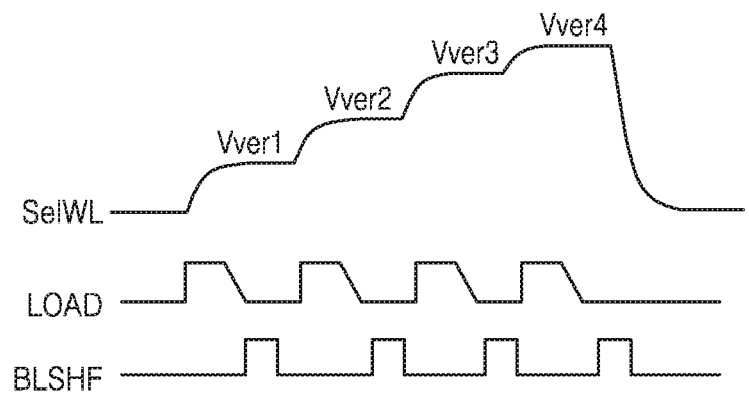
FIGS. 15A and 15B are timing charts illustrating verifying operations according to an embodiment of the disclosure.
Figure 15B:
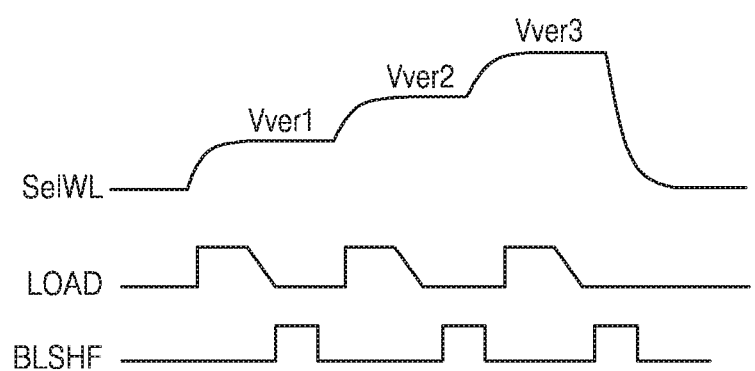

FIGS. 15A and 15B are timing charts illustrating the verifying operations according to an embodiment of the disclosure. More particularly, FIGS. 15A and 15B illustrate examples in which the nonvolatile memory device 10 adjusts a verifying level as one of the verifying conditions.

With reference to FIGS. 12, 13, 15A and 15B, FIG. 15A illustrates an embodiment corresponding to FIG. 13 in which the adjacent word line is in the low-level program state, and FIG. 15B illustrates an embodiment corresponding to FIG. 13B in which the adjacent word line is in the high-level program state. With reference to 15A, in order to perform the verifying operations, first through fourth verifying voltages Vver1 through Vver4 may be sequentially applied to the selected word line SelWL. The fourth verifying voltage Vver4 may have a higher voltage level than a third verifying voltage Vver3. When the adjacent word line is in a low-level program state, the nonvolatile memory device 10 may further apply the fourth verifying voltage Vver4 having a higher voltage level than the first through third verifying voltages Vver 1 through Vver3 to the selected word line SelWL.

Also, with reference to FIG. 15B, the first through third verifying voltages Vver1 through Vver3 may be sequentially applied to the selected word line SelWL in order to perform the verifying operations. When the adjacent word line is in the high-level program state, the nonvolatile memory device 10 may apply the first through third voltage levels Vver1 through Vver3 having lower voltage levels than the fourth verifying voltage Vver4 to the selected word line SelWL.

According to an embodiment of the disclosure, when the adjacent word line is in the low-level program state, the nonvolatile memory device 10 may perform more charge sharing on the memory cell connected to the selected word line SelWL by further applying the fourth verifying voltage Vver4 with the higher voltage level to the adjacent word line. Accordingly, the dispersion of the memory cells connected to the selected word line SelWL may be formed relatively on the right (that is, a high voltage).

Figure 16:
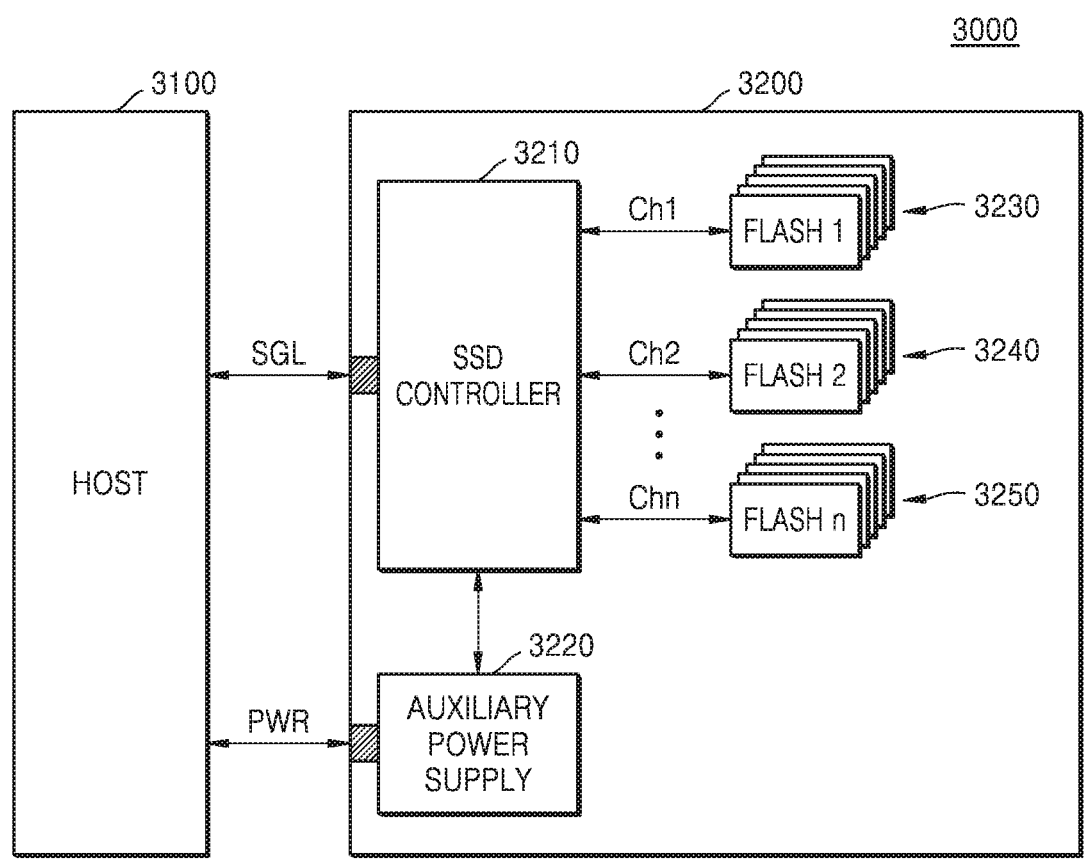
FIG. 16 is a block diagram of an example in which a nonvolatile memory device is applied to a solid-state drive (SSD) system, according to an embodiment of the present disclosure.

FIG. 16 is a diagram illustrating a computing system apparatus including the nonvolatile memory device according to an embodiment.

FIG. 16 is a block diagram of an example in which a nonvolatile memory device is applied to a solid-state drive (SSD) system, according to an embodiment of the present disclosure.

Referring to FIG. 16, an SSD system 3000 may include a host (HOST) 3100 and an SSD 3200. The SSD 3200 may exchange signals SGL with the host (HOST) 3100 via a signal connector and receive power PWR via a power connector. The SSD 3200 may include an SSD controller 3210, an auxiliary power supply 3220, and flash memory devices 3230, 3240, and 3250. The SSD controller 3210 communicates with flash memory devices 3230 through a first channel CH1, communicates with flash memory devices 3240 through a second channel CH2, and communicates with flash memory devices 3250 through an $n^{th}$ channel CHn. In this case, the SSD 3200 may be realized by using embodiments illustrated in FIGS. 1 through 15.

The nonvolatile memory device 10 of FIGS. 1 through 15 may be applied to at least one of the flash memory devices 3230, 3240, and 3250. In other words, the nonvolatile memory device 10 may adaptively adjust the verifying conditions of the selected word line based on the result of reading with respect to the adjacent word line.

A nonvolatile memory device according to an embodiment of the present disclosure, may be applied not only to the SSD 3200 but also to a memory card system, a computing system, a universal flash storage (UFS), etc. In addition, the operation method of the nonvolatile memory device according to an embodiment of the present disclosure may be applied to various electronic systems including nonvolatile memories.

As is traditional in the field, embodiments may be described and illustrated in terms of blocks which carry out a described function or functions. These blocks, which may be referred to herein as units or modules or the like, are physically implemented by analog and/or digital circuits such as logic gates, integrated circuits, microprocessors, microcontrollers, memory circuits, passive electronic components, active electronic components, optical components, hardwired circuits and the like, and may optionally be driven by firmware and/or software. The circuits may, for example, be embodied in one or more semiconductor chips, or on substrate supports such as printed circuit boards and the like. The circuits constituting a block may be implemented by dedicated hardware, or by a processor (e.g., one or more programmed microprocessors and associated circuitry), or by a combination of dedicated hardware to perform some functions of the block and a processor to perform other functions of the block. Each block of the embodiments may be physically separated into two or more interacting and discrete blocks without departing from the scope of the disclosure. Likewise, the blocks of the embodiments may be physically combined into more complex blocks without departing from the scope of the disclosure.

While the disclosure has been particularly shown and described with reference to embodiments thereof, it will be understood that various changes in form and details may be made therein without departing from the spirit and scope of the following claims.

What is claimed is:

1. An operation method executed by a nonvolatile memory device, the method comprising:
   applying a programming voltage to a selected word line and programming a selected memory cell that is connected to the selected word line;
   reading an adjacent memory cell that is connected to an adjacent word line of the selected word line; and
   verifying the selected memory cell by adjusting charge sharing between the selected memory cell and a sensing node, which is connected to the selected memory cell through a bit line, based on a result of reading the adjacent memory cell.

2. The operation method of claim 1, wherein:
   the verifying of the selected memory cell comprises changing a sensing time to control the charge sharing of the sensing node based on a result of reading the adjacent memory cell, and
   the sensing time is a time that a bit line sensing signal is applied.

3. The operation method of claim 2, wherein:
   the selected memory cell is programmed to be one from an erase state to an Nth (N is a natural number equal to or greater than 1) program state, and
   the reading of the adjacent memory cell comprises determining whether the adjacent memory cell is programmed to be one from the erase state through the Nth program state.

4. The operation method of claim 3, wherein the verifying of the selected memory cell comprises:
   determining the sensing time as a first sensing time in response to determining that the adjacent memory cell is programmed to be one from the erase state through a Kth (K is a natural number equal to or less than N) state; and
   determining the sensing time as a second sensing time in response to determining that the adjacent memory cell is programmed to be one from a K+1th program state to the Nth program state.

5. The operation method of claim 4, wherein the first sensing time is longer than the second sensing time.

6. The operation method of claim 3, wherein the verifying of the selected memory cell comprises:

determining the sensing time to be a first sensing time in response to determining that the adjacent memory cell is programmed to be the erase state; and determining the sensing time to be a second sensing time in response to determining that the adjacent memory cell is programmed to be one from a first program state through the Nth program state.

7. The operation method of claim 3, wherein in the verifying of the selected memory cell, the sensing time is not changed in response to determining that the selected memory cell is programmed to be one of the erase state to an Lth (L is a natural number equal to or greater than 1 and equal to or less than N) program state.

8. The operation method of claim 3, wherein:

the selected memory cell is programmed to an Mth (M is a natural number equal to or greater than 1 and equal to or less than N) program state, and the verifying of the selected memory cell comprises:

determining the sensing time as a first sensing time in response to determining that the adjacent memory cell is programmed to be one from the erase state to an (M-P)th (P is a natural number equal to or greater than 1) program state; and determining the sensing time as a second sensing time in response to determining that the adjacent memory cell is programmed to be one from an (M-P+1)th program state to an Nth program state.

9. The operation method of claim 1, wherein the verifying of the selected memory cell comprises changing a verifying voltage level applied to the selected word line based on a result of reading the adjacent memory cell.

10. The operation method of claim 1, wherein the reading of the adjacent memory cell is performed at one of a first point before the programming of the selected memory cell and a second point after the programming of the selected memory cell.

11. The operation method of claim 1, wherein the adjacent word line is arranged directly above or directly under the selected word line.

12. A nonvolatile memory device comprising:

a memory cell array comprising a plurality of flash memory cells connected to a plurality of bit lines;

a row decoder configured to be connected by a plurality of word lines, a string selection line, and a ground selection line;

a page buffer configured to transfer a bit line voltage on the plurality of bit lines and detect data stored in the flash memory cells through at least one bit line among the plurality of bit lines; and a control logic performing verification on a selected memory cell by reading an adjacent word line of a selected word line addressing the selected memory cell and adjusting charge sharing between the selected memory cell and a sensing node, which is connected to the selected memory cell through the at least one bit line, based on a result of reading the adjacent word line, wherein:

the control logic changes a sensing time based on a result of reading the adjacent word line, and the sensing time is a time that a bit line sensing signal is applied to control charge sharing of the sensing node.

13. The nonvolatile memory device of claim 12, wherein the memory cell array includes a plurality of memory blocks each comprising a plurality of cell strings, each of cell strings comprises the plurality of flash memory cells stacked in a direction perpendicular to a substrate, a ground selection transistor disposed between the flash memory cells and the substrate, and a string selection transistor disposed between the flash memory cells and the at least one bit line.

14. The nonvolatile memory device of claim 13, wherein the control logic:

determines the sensing time to be a first sensing time in response to determining that a memory cell connected to the adjacent word line is programmed to be in a first program state, and determines the sensing time to be a second sensing time in response to determining that the memory cell connected to the adjacent word line is programmed to be in a second program state having a higher threshold voltage than in the first program state, the first sensing time being longer than the second sensing time.

15. The nonvolatile memory device of claim 12, wherein the control logic changes a verifying voltage level applied to the selected word line based on a result of reading the adjacent word line.

16. A method executed by a nonvolatile memory device, the method comprising:

programming a selected memory cell addressed by a selected word line;

reading an adjacent memory cell addressed by an adjacent word line, which is adjacent to the selected word line, to determine a program state of the adjacent memory cell;

determining, based upon the program state, whether to apply a first verification operation or a second verification operation, which differs from the first verification operation, as a selected verification operation; and applying the selected verification operation to the selected memory cell for determining whether the selected memory cell is programmed to a predetermined program state.

17. The method of claim 16, wherein the first verification operation lengthens, with respect to the second verification operation, an amount of time that a maximum voltage is applied to the selected memory cell.

18. The method of claim 16, wherein the first verification operation increases, with respect to the second verification operation, a number of different verify voltages that are applied to the selected memory cell.

19. The method of claim 16, wherein the first verification operation increases, with respect to the second verification operation, a greatest verify voltage that is applied to the selected memory cell.

20. The method of claim 16, wherein the first verification operation is determined to be applied as the selected verification operation in response to determining that the program state of the adjacent memory cell has a lesser threshold voltage than a reference program state.

* * * * *